(12) United States Patent
Ueno et al.

(10) Patent No.: US 7,915,600 B2
(45) Date of Patent: Mar. 29, 2011

(54) EXTREME ULTRA VIOLET LIGHT SOURCE APPARATUS

(75) Inventors: Yoshifumi Ueno, Hiratsuka (JP); Georg Soumagne, Kamakura (JP); Akira Sumitani, Isehara (JP); Osamu Wakabayashi, Hiratsuka (JP)

(73) Assignees: Komatsu Ltd., Tokyo (JP); Gigaphoton Inc., Tokyo (JP)

( * ) Notice: Subject to any disclaimer, the term of this patent is extended or adjusted under 35 U.S.C. 154(b) by 471 days.

(21) Appl. No.: 11/870,020

(22) Filed: Oct. 10, 2007

(65) Prior Publication Data

US 2008/0087840 A1   Apr. 17, 2008

(30) Foreign Application Priority Data

Oct. 16, 2006   (JP) .................. 2006-281186

(51) Int. Cl.
    *G01J 1/00* (2006.01)
(52) U.S. Cl. .................................. 250/504 R
(58) Field of Classification Search .............. 250/504 R; 378/119
    See application file for complete search history.

(56) References Cited

U.S. PATENT DOCUMENTS

| | | | | |
|---|---|---|---|---|
| 4,704,718 A | * | 11/1987 | Suckewer | 372/5 |
| 6,307,913 B1 | * | 10/2001 | Foster et al. | 378/34 |
| 6,977,383 B2 | * | 12/2005 | Rieger et al. | 250/398 |
| 6,987,279 B2 | * | 1/2006 | Hoshino et al. | 250/504 R |
| 7,067,832 B2 | * | 6/2006 | Mizoguchi et al. | 250/504 R |
| 7,609,816 B2 | * | 10/2009 | Rocca | 378/143 |
| 2005/0279946 A1 | | 12/2005 | Rettig et al. | |

FOREIGN PATENT DOCUMENTS

| WO | 02/46839 | 6/2002 |
|---|---|---|
| WO | 2004/092693 | 10/2004 |

OTHER PUBLICATIONS

Takeshi Kobayashi, et al., "*Generation and Control of Ablation Plasma 1 (Laser)*", Journal of Plasma and Fusion Research, vol. 76, No. 11, Nov. 2000, pp. 1145-1150.
Björn A. Hansson et al., "*LLP EUV Source Development for HVM*", SPIE, vol. 6151, No. 61510R, Feb. 2006.

* cited by examiner

*Primary Examiner* — Kiet T Nguyen
(74) *Attorney, Agent, or Firm* — Wenderoth, Lind & Ponack, L.L.P.

(57) ABSTRACT

An extreme ultra violet light source apparatus has a relatively high output for exposure and suppresses the production of debris as much as possible instead of disposing of debris that has been produced. The extreme ultra violet light source apparatus includes: a chamber in which extreme ultra violet light is generated; a target supply unit for supplying solid tin or lithium as a target to a predetermined position within the chamber; a $CO_2$ laser for applying a laser beam based on pulse operation to the target supplied by the target supply unit so as to generate plasma; and a collector mirror having a multilayer film on a reflecting surface thereof, for collecting the extreme ultra violet light radiated from the plasma to output the extreme ultra violet light.

20 Claims, 18 Drawing Sheets

| TYPE OF LASER | WAVELENGTH $\lambda$ | CRITICAL DENSITY $N_c$ |
|---|---|---|
| $CO_2$ LASER | 10.6 $\mu$m | $10^{19} cm^{-3}$ |
| Nd:YAG LASER | 1.06 $\mu$m | $10^{21} cm^{-3}$ |

(a)  (b)

(a)  (b)

(a)        (b)

EXTREME ULTRA VIOLET LIGHT SOURCE APPARATUS

BACKGROUND OF THE INVENTION

1. Field of the Invention

The present invention relates to an extreme ultra violet (EUV) light source apparatus to be used as a light source of exposure equipment.

2. Description of a Related Art

In recent years, photolithography has made rapid progress to finer fabrication with finer semiconductor processes. In the next generation, microfabrication of 100 nm to 70 nm, and further, microfabrication of 50 nm or less will be required. Accordingly, in order to fulfill the requirement for microfabrication of 50 nm or less, for example, exposure equipment is expected to be developed by combining an EUV light source generating EUV light with a wavelength of about 13 nm and reduced projection reflective optics.

There are three kinds of EUV light sources, namely, an LPP (laser produced plasma) light source using plasma generated by applying a laser beam to a target, a DPP (discharge produced plasma) light source using plasma generated by electric discharge, and an SR (synchrotron radiation) light source using orbital radiation. Among them, the LPP light source has the advantages that extremely high intensity near black body radiation can be obtained because plasma density can be considerably made larger, that light emission of only the necessary waveband can be performed by selecting the target material, that an extremely large collection solid angle of $2\pi$ steradian can be ensured because of a point light source having substantially an isotropic angle distribution and no structure surrounding the light source such as electrodes, and so on. Therefore, the LPP light source is thought to be predominant as a light source for EUV lithography requiring power of several tens of watts or more.

Here, a principle of generating EUV light with the LPP system will be explained. When a laser beam is applied to a target material supplied into a vacuum chamber, the target material is excited and plasmarized. Various wavelength components including EUV light are radiated from the plasma. Then, the EUV light is reflected and collected by using an EUV collector mirror that selectively reflects a desired wavelength component (e.g., a component having a wavelength of 13.5 nm), and outputted to an exposure unit. For this purpose, a multilayer film in which thin films of molybdenum (Mo) and thin films of silicon (Si) are alternately stacked (Mo/Si multilayer film), for example, is formed on the reflecting surface of the EUV collector mirror.

In the LPP EUV light source apparatus, the influence by neutral particles and ions emitted from plasma is problematic especially when a solid target is used. Since the EUV collector mirror is located near the plasma, the neutral particles emitted from the plasma are deposited on the reflecting surface of the EUV collector mirror and reduce the reflectance of the mirror. On the other hand, the ions emitted from the plasma wears away the multilayer film formed on the reflecting surface of the EUV collector mirror (the shaving is also defined as "sputtering" in the present application). The scattered materials from the plasma including neutral particles and ions, and the remains of the target materials are called debris.

In order to maintain the high reflectance, the high flatness of about 0.2 nm (rms), for example, is required for the EUV collector mirror, and thus the mirror is very expensive. Accordingly, longer life of the EUV collector mirror is desired in view of reduction in operation costs of the exposure equipment, reduction in maintenance time, and so on. The mirror life in the EUV light source apparatus for exposure is defined as a period until the reflectance decreases 10%, for example, and at least one-year life is required.

In order to fulfill this requirement, International Publication WO 02/46839 A2 discloses special liquid droplet targets that are irradiated by a high power laser and are plasmarized to form a point source of EUV, XUV or X-ray. As various types of liquid droplet targets, solutions of metallic chloride, metallic bromide, and so on, or nano-sized particles (e.g., aluminum, bismuth, or the like) in solutions (e.g., water or oil) having a melting temperature lower than the melting temperature of some of the constituent metals are used. Since the target is in the form of droplets, the sufficient distance from the nozzle supplying the target to the plasma can be secured. Further, by restricting the mass of the target, the debris can be suppressed.

However, when the mass of the target is restricted to the degree that no debris is produced at all, various technical problems may occur and the apparatus may be complicated. For example, clogging occurs in the nozzle for supplying the target, and the EUV conversion efficiency (CE) decreases according to the reduction in target size. On the other hand, for optimization of the target size and density in order to improve the EUV conversion efficiency, it is necessary to expand the droplets by using pre-pulse laser.

Further, International Publication WO 2004/092693 A2 discloses a method and apparatus for debris removal from a reflecting surface of an EUV collector mirror in an EUV light source. Specifically, in FIGS. 2A and 2B of WO 2004/092693 A2, a debris shield including plural thin plates that define radially extending optical paths is shown. By locating the debris shield between a point light source formed at the plasma center and the EUV collector mirror, the debris deposited on the reflecting surface of the EUV collector mirror can be reduced.

However, since the debris shield is exposed to the plasma, the thin plates of the debris shield is worn away by fast ions and debris is produced, and the produced debris may be deposited on the reflecting surface of the EUV collector mirror. In this case, the debris shield itself becomes a debris source.

Furthermore, US Patent Application Publication US 2005/0279946 A1 discloses a system for protecting an internal EUV light source component from ions generated at a plasma formation site. In one aspect, the system may comprise a plurality of foil plates and equipment for generating a magnetic field to deflect ions into a surface of one of the foil plates. In another aspect, an electrostatic grid may be positioned for interaction with ions to reduce ion energy. However, the method of guiding debris by using a magnetic field or electric field is effective for ions, but not effective for neutral particles.

When a metallic film is deposited on the reflecting surface of the EUV collector mirror, EUV light is absorbed while making a round trip through the metallic film. Accordingly, when the optical transmittance of the metallic film becomes about 95%, the reflectance of the EUV collector mirror becomes about 90%. In order to hold the reduction in reflectance of the EUV collector mirror within 10% with respect to EUV light having a wavelength of 13.5 nm, the acceptable value of the amount of deposition (thickness) of the metallic film on the reflecting surface of the EUV collector mirror is a very little value such as about 0.75 nm for tin (Sn) and about 5 nm for lithium (Li).

Therefore, the achievement of one-year mirror life is considered to be very difficult in an EUV light source apparatus for exposure having output of about 115 W to 180 W at the focusing point only by restricting the mass of the target or providing a debris shield.

SUMMARY OF THE INVENTION

The present invention has been achieved in view of the above-mentioned problems. A purpose of the present invention is, in an EUV light source apparatus having relatively high output for exposure, not to dispose of debris that has been produced, but to suppress the production of debris as possible.

In order to accomplish the above purpose, an extreme ultra violet light source apparatus according to one aspect of the present invention is an extreme ultra violet light source apparatus which generates extreme ultra violet light by applying a laser beam to a target, and the apparatus includes: a chamber in which extreme ultra violet light is generated; a target supply unit which supplies one of solid tin and solid lithium as a target to a predetermined position within the chamber; a $CO_2$ laser which applies a laser beam based on pulse operation to the target supplied by the target supply unit so as to generate plasma; and a collector mirror which has a multilayer film on a reflecting surface thereof and collects the extreme ultra violet light radiated from the plasma to output the extreme ultra violet light.

Here, it is desirable that the $CO_2$ laser applies a laser beam, which has intensity of $3 \times 10^9$ W/cm$^2$ to $5 \times 10^{10}$ W/cm$^2$ and/or a pulse width of 10 ns to 15 ns, to the target supplied by the target supply unit.

According to the present invention, production of debris can be suppressed as much as possible by applying a laser beam having a relatively long wavelength generated by the $CO_2$ laser to the target of solid tin or lithium.

DETAILED DESCRIPTION OF THE INVENTION

Figure 1:
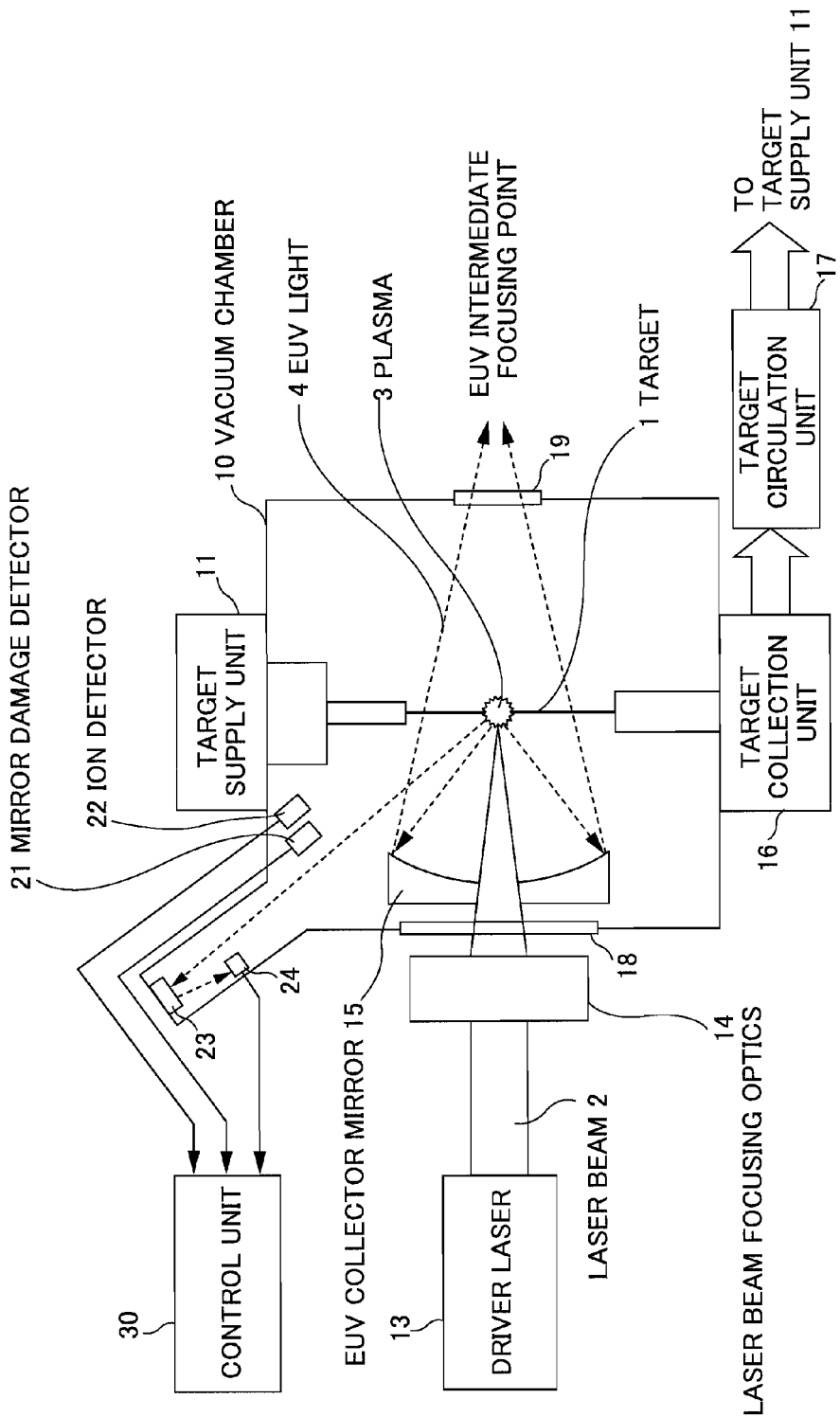
FIG. 1 is a side view showing an internal structure of an EUV light source apparatus according to the first embodiment of the present invention.

Hereinafter, preferred embodiments of the present invention will be explained in detail by referring to the drawings. The same reference numerals are assigned to the same component elements and the description thereof will be omitted.

Figure 2:
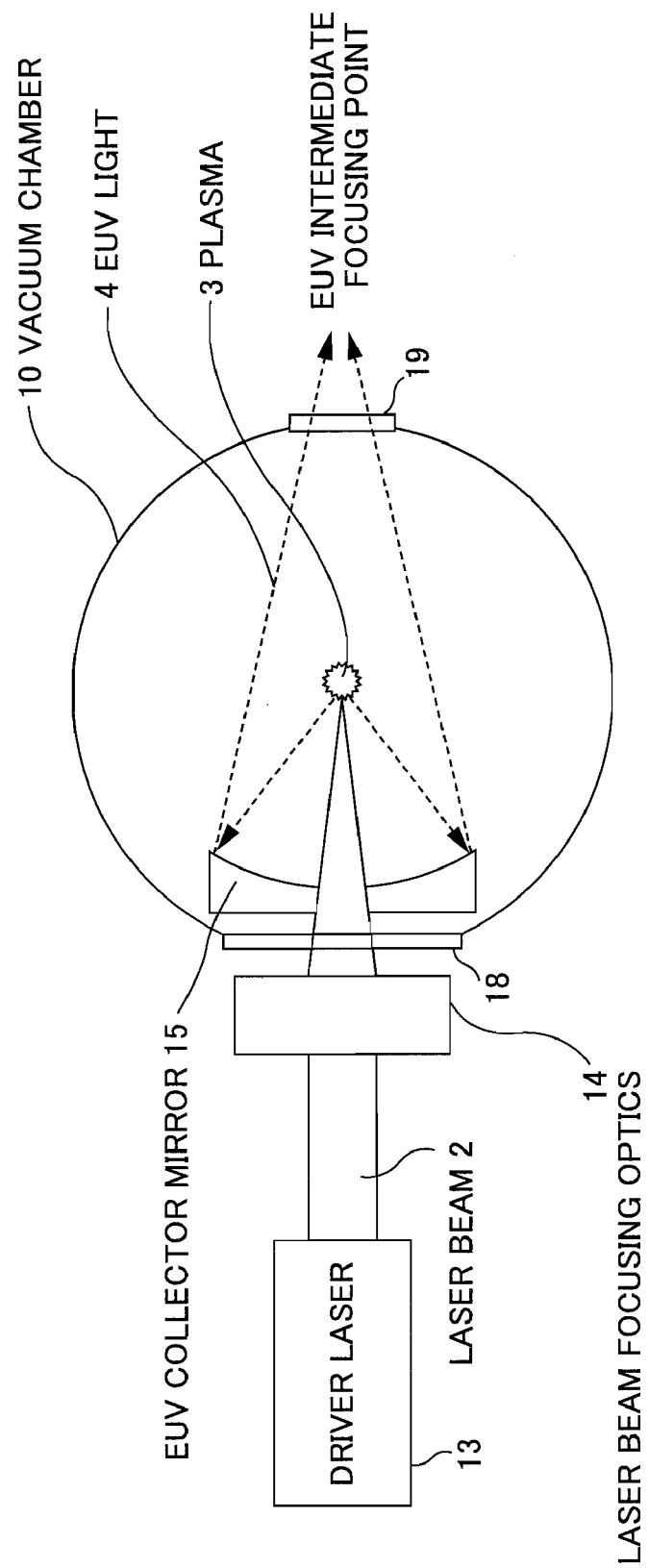
FIG. 2 is a plan view showing the internal structure of the EUV light source apparatus according to the first embodiment of the present invention.

FIG. 1 is a side view showing an internal structure of an EUV light source apparatus according to the first embodiment of the present invention, and FIG. 2 is a plan view showing the internal structure of the EUV light source apparatus according to the first embodiment of the present invention. The EUV light source apparatus according to the embodiment employs a laser produced plasma (LPP) system of generating EUV light by applying a laser beam to a target material for excitation.

As shown in FIGS. 1 and 2, the EUV light source apparatus includes a vacuum chamber 10 in which EUV light is generated, a target supply unit 11 that supplies a target 1, a driver laser 13 that generates an excitation laser beam 2 to be applied to the target 1, a laser beam focusing optics 14 that collects the excitation laser beam 2 generated by the driver laser 13, an EUV collector mirror 15 that collects EUV light 4 emitted from plasma 3, which is generated when the excitation laser beam 2 is applied to the target 1, to output the EUV light 4, a target collection unit 16 that collects the target 1, a target circulation unit 17 that circulates the target 1, and a control unit 30 that controls the entire EUV light source apparatus.

The vacuum chamber 10 is provided with a lead-in window 18 that leads in the excitation laser beam 2 and a lead-out window 19 that leads out the EUV light radiated from the plasma to an exposure unit. The interior of the exposure unit is held in vacuum or under reduced pressure as well as the interior of the vacuum chamber 10. The target supply unit 11 includes a position adjustment mechanism for adjusting the position of the target 1 to be applied with the excitation laser beam 2, and supplies the target 1 to a predetermined position of the vacuum chamber 10 while adjusting the position of the target 1.

The driver laser 13 is a laser beam source capable of pulse oscillation at a high repetition frequency (e.g., the pulse width is about several nanoseconds to several tens of nanoseconds, and the frequency is about 1 kHz to about 100 kHz). Further, the laser beam focusing optics 14 includes at least one lens and/or at least one mirror. The laser beam 2 collected by the laser beam focusing optics 14 is applied at the predetermined position within the vacuum chamber 10 to the target supplied by the target supply unit 11, and thereby, part of the target 1 is excited and plasmarized, and various wavelength components are radiated from a light emission point. Here, the light emission point refers to a position where the plasma 3 is generated.

The EUV collector mirror 15 is a collection optics that selectively reflects and collects a predetermined wavelength component (e.g., EUV light near 13.5 nm) of the various wavelength components radiated from the plasma 3. The EUV collector mirror 15 has a concave reflecting surface, and a multilayer film of molybdenum (Mo) and silicon (Si) for selectively reflecting the EUV light near 13.5 nm in wavelength, for example, is formed on the reflecting surface. In FIG. 1, the EUV light is reflected to the right by the EUV collector mirror 15, collected at an EUV intermediate focusing point, and then, outputted to the exposure unit. The collection optics of EUV light is not limited to the EUV collector mirror 15 shown in FIG. 1, but the collection optics may be configured by using plural optical components to be a reflection optics for suppressing absorption of EUV light.

The target collection unit 16 includes a position adjustment mechanism for adjusting the position of the target 1 to be applied with the excitation laser beam 2, and located in a position facing the target supply unit 11 with the light emission point in between. The target collection unit 16 collects the targets that have not been plasmarized. The collected targets may be returned to the target supply unit 11 by the target circulation unit 17 to be reused.

Furthermore, the EUV light source apparatus includes a mirror damage detector 21 for detecting an amount of neutral particles emitted from the plasma 3, an ion detector 22 for detecting an amount of ions emitted from the plasma 3, and a multilayer film mirror 23 and an EUV light detector 24 for detecting the intensity of EUV light in the light emission point not via the EUV collector mirror 15.

The mirror damage detector 21 includes a QCM (quartz crystal microbalance), for example. The QCM is a sensor capable of measuring the change in thickness of a sample film (a film for measurement) of gold (Au) or the like formed on the sensor surface based on the change in resonance frequency of a quartz crystal with an accuracy within one angstrom in real time. An amount of neutral particles deposited on the reflecting surface of the EUV collector mirror (hereinafter, also referred to as "deposition amount") can be obtained based on the change in thickness of the sample film detected by the mirror damage detector 21.

The ion detector 22 includes a Faraday cup, for example. An amount of multilayer film worn away from the reflecting surface of the EUV collector mirror (hereinafter, also referred to as "sputtering amount") can be obtained based on the amount of ions detected by the ion detector 22.

On the multilayer mirror 23, a multilayer film of molybdenum and silicon that has high reflectance to the wavelength near 13.5 nm, for example, is formed. The EUV light detector 24 includes a zirconium (Zr) filter and a photodiode, for example. The zirconium filter cuts light having a wavelength longer than 20 nm. The photo diode outputs a detection signal corresponding to the intensity or energy of incident light.

In the embodiment, a $CO_2$ laser capable of generating light having a relatively long wavelength is used as the driver laser 13. Further, solid tin (Sn) or lithium (Li) is used as the target 1. The reason is as follows.

Generally, it is known that, when a laser beam is applied to a target and plasma is generated, the melting layer on the target surface is suddenly boiled or the expansion pressure of the plasma is applied to the target, and part of the melting target is granulated and spouted (see Kobayashi et al., "Generation and Control of Ablation Plasma 1 (Laser)", JOURNAL OF PLASMA AND FUSION RESEARCH, Vol. 76, NO. 11 (November 2000), pp. 1145-1150).

Especially, in a plasma light source using a solid target, there are a high-temperature low-density plasma region that generates a radiant ray in a short wavelength range such as EUV light and a low-temperature high-density plasma region that generates no radiant ray in the short wavelength range. One of them, the low-temperature high-density plasma region serves as a heat source that generates a large amount of debris from the target material after laser radiation. A melting layer is formed on the surface of the target by the heat source and the melted metal is spouted and scattered due to expansion pressure of the plasma, and thus, debris is generated.

The process will be specifically explained. When a laser beam is applied to the target material, the target material is heated and ionized by the laser beam, and plasma is generated. Then, the laser beam is absorbed by the plasma. The mechanism of absorption of the laser beam by the plasma is an absorption mechanism of a reversal process to the Bremsstrahlung or braking radiation that emits electromagnetic wave (laser beam) when an electron is accelerated in an electric field formed by ions, and called inverse-Bremsstrahlung absorption. The inverse-Bremsstrahlung absorption is the most basic absorption mechanism occurring in laser generated plasma, and also called classical absorption. The electron vibrating due to a high-frequency electric field causes energy absorption while colliding with ions.

In the plasma, the electromagnetic wave (laser beam) can propagate only when it has a higher frequency than the frequency of the electron plasma. That is, given that an angular frequency of the laser beam is $\omega_L$ and an angular frequency of the electron plasma is $\omega_P$, the laser beam propagates only in the low-density plasma region where $\omega_L > \omega_P$ holds. Here, a plasma electron density $N_E$ in which $\omega_L = \omega_P$ holds is called critical density $N_C$.

When the laser beam is applied to the solid target, since there is plasma that is spouted and expands from the target surface, the laser beam propagates from the region with lower plasma density to the region with higher plasma density while being absorbed, and reflected at the critical density region. That is, the laser beam is absorbed in both optical paths to and from the critical density region in the plasma. Therefore, as the critical density is higher, the energy can be absorbed by the higher density plasma, and simultaneously, the risk becomes greater that the low-temperature high-density plasma region causing debris generation is produced.

The critical density $N_c$ is expressed by the following equation.

$$N_C (cm^{-3}) = 1.11 \times 10^{13} / \lambda^2$$

Where $\lambda$ represents the wavelength of the laser beam.

Figures 3, 4:
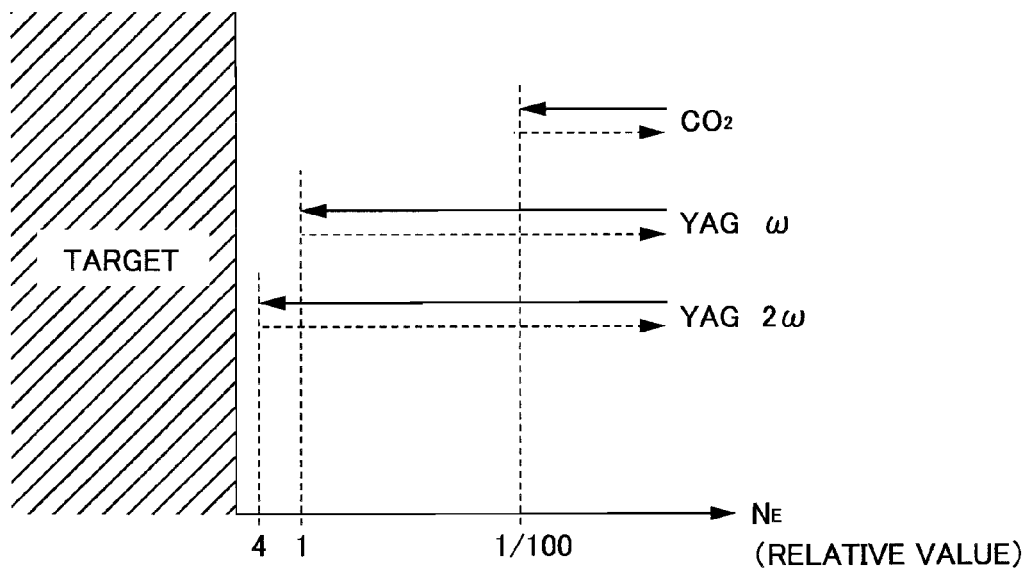
FIG. 3 shows wavelengths and critical density of a $CO_2$ laser and an Nd:YAG laser.
FIG. 4 shows a state in which a laser beam is reflected from the vicinity of the target.

FIG. 3 shows wavelengths and critical density of a $CO_2$ laser and an Nd:YAG laser. The $CO_2$ laser has the wavelength $\lambda$ of the output laser beam an order of magnitude greater than that of the Nd:YAG laser, and the critical density $N_c$ is two orders of magnitude less. Consequently, as shown in FIG. 4, the laser beam outputted from the $CO_2$ laser is reflected at the high-temperature low-density plasma region, which is significantly apart from the target surface. In FIG. 4, the horizontal axis indicates the plasma electron density $N_E$ corresponding to the distance from the target surface. Further, regarding the Nd:YAG laser, the cases of fundamental wave $\omega$ (wavelength 1064 nm) and the second harmonic wave $2\omega$ (wavelength 532 nm) are shown.

Using the $CO_2$ laser as the drive laser, generation of the high-temperature low-density plasma region as a heat source that does not contribute to EUV light generation but produces debris is suppressed. Thereby, the melting of the solid target surface does not make progress and the neutral particles emitted from the target and deposited on the reflecting surface of the EUV collector mirror are significantly reduced. On the other hand, also fast ions are emitted from the plasma, and the multilayer film formed on the reflecting surface of the EUV collector mirror is worn away.

Furthermore, when solid tin (Sn) or lithium (Li) is used as the target, the number of neutral particles generated from the target is much smaller. Accordingly, it has been verified that the amount of neutral particles deposited on the reflecting surface of the EUV collector mirror (deposition amount) and the amount of multilayer film worn away from the reflecting surface of the EUV collector mirror (sputtering amount) can be balanced, or the deposition amount can be made smaller than the sputtering amount under predetermined conditions. Thereby, the problem that debris is deposited on the reflecting surface of the EUV collector mirror can be solved.

The conditions therefor are principally determined by intensity and/or pulse width of the excitation laser beam generated by the $CO_2$ laser. Specifically, it is desirable that the intensity of the excitation laser beam is set to $3 \times 10^9$ W/cm$^2$ to $5 \times 10^{10}$ W/cm$^2$, more preferably, $5 \times 10^9$ W/cm$^2$ to $3 \times 10^{10}$ W/cm$^2$. Further, it is desirable that the pulse width of the excitation laser beam is set to a relatively short value as about 10 ns to 15 ns.

In the intensity of the excitation laser beam, the upper limit is set such that the melting region on the target surface may not be unnecessarily expanded due to excessive heat application to the target, and thereby, production of debris can be suppressed. On the other hand, since the intensity of the excitation laser beam is greatly affected on the EUV conversion efficiency (CE), the lower limit is set such that the EUV conversion efficiency may be secured above a certain level. The relationship between the excitation laser beam intensity and the EUV conversion efficiency is also disclosed in Hansson et al., "LPP EUV Source Development for HVM", SPIE, Vol. 6151, No. 61510R (February, 2006).

Here, laser beam intensity is expressed by the following expression.

Laser beam intensity (W/cm$^2$)=Laser beam energy (J)/{Pulse width (s)·Spot area (cm$^2$)}

In the embodiment, the collection diameter of the laser beam is about 100 μm and the spot area is about $7.85 \times 10^{-5}$ cm$^2$, and the laser beam energy is determined to adapt the conditions. For example, when the pulse width of the excitation laser beam is set to 12.5 ns, the laser beam energy is about 30 mJ.

Next, a laser beam application experiment when solid tin is used as the target will be explained.

Figure 5:
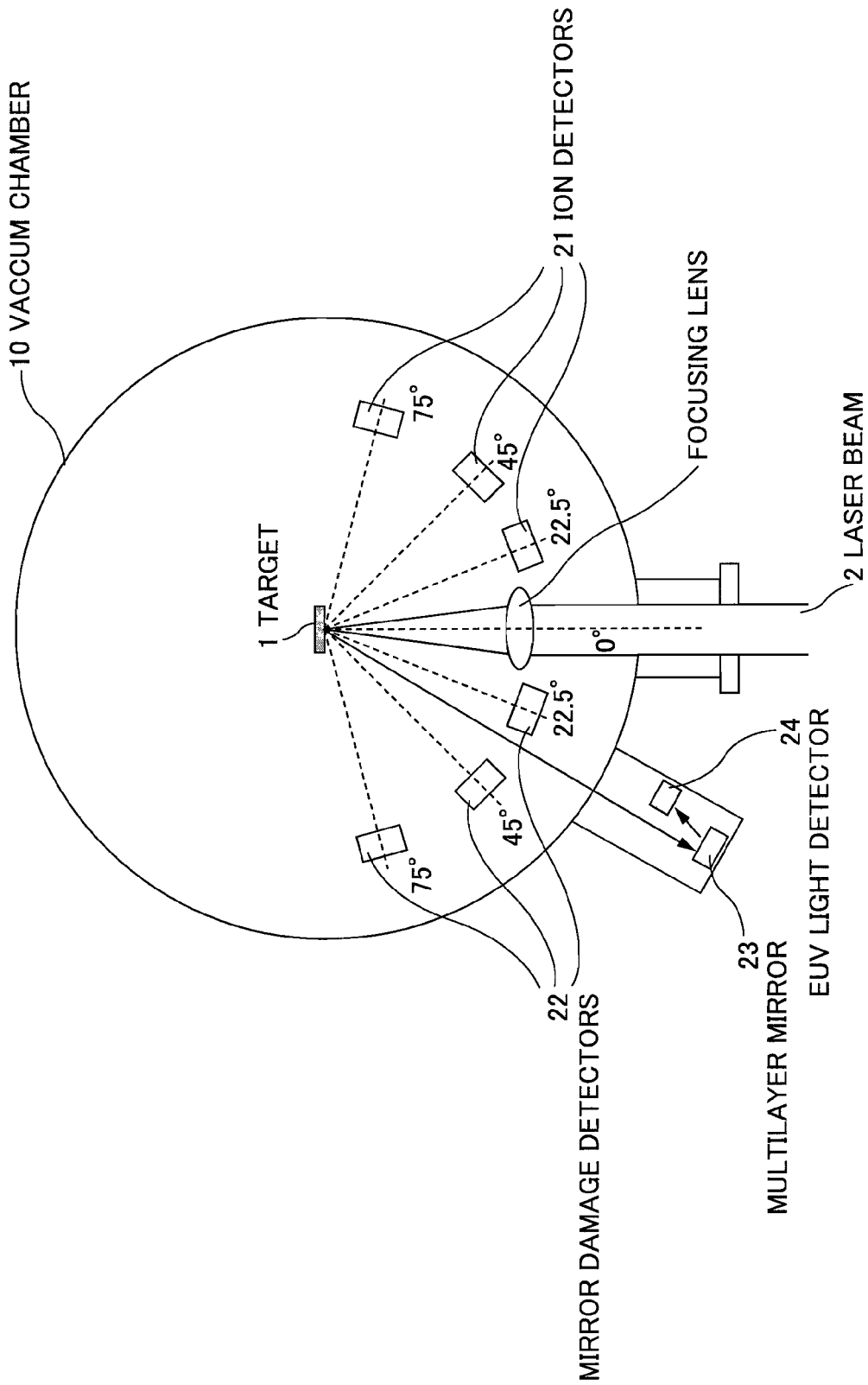
FIG. 5 is a plan view showing an arrangement of detectors in a laser beam application experiment.

FIG. 5 is a plan view showing an arrangement of detectors in a laser beam application experiment. In this experiment, a focusing lens is used as the laser beam focusing optics 14 shown in FIG. 2. Defining that the incident direction of the excitation laser beam 2 to the target 1 corresponds to a reference angle 0°, three mirror damage detectors 21 are respectively located in three positions counterclockwise at angles of 22.5°, 45°, 75° and three ion detectors 22 are respectively located in three positions clockwise at angles of 22.5°, 45°, 75° when seen from vertically above.

On the assumption that the amounts of neutral particles and the amounts of ions emitted from the plasmarized tin target 1 are symmetric with respect to the reference angle, the amounts of neutral particles and the amounts of ions can be measured at the same time in the positions at the three angles with respect to the reference angle. Therefore, the total change in film thickness, i.e., the rate of deposition or sputtering if the EUV collector mirrors are located in the positions can be obtained.

Figure 6:
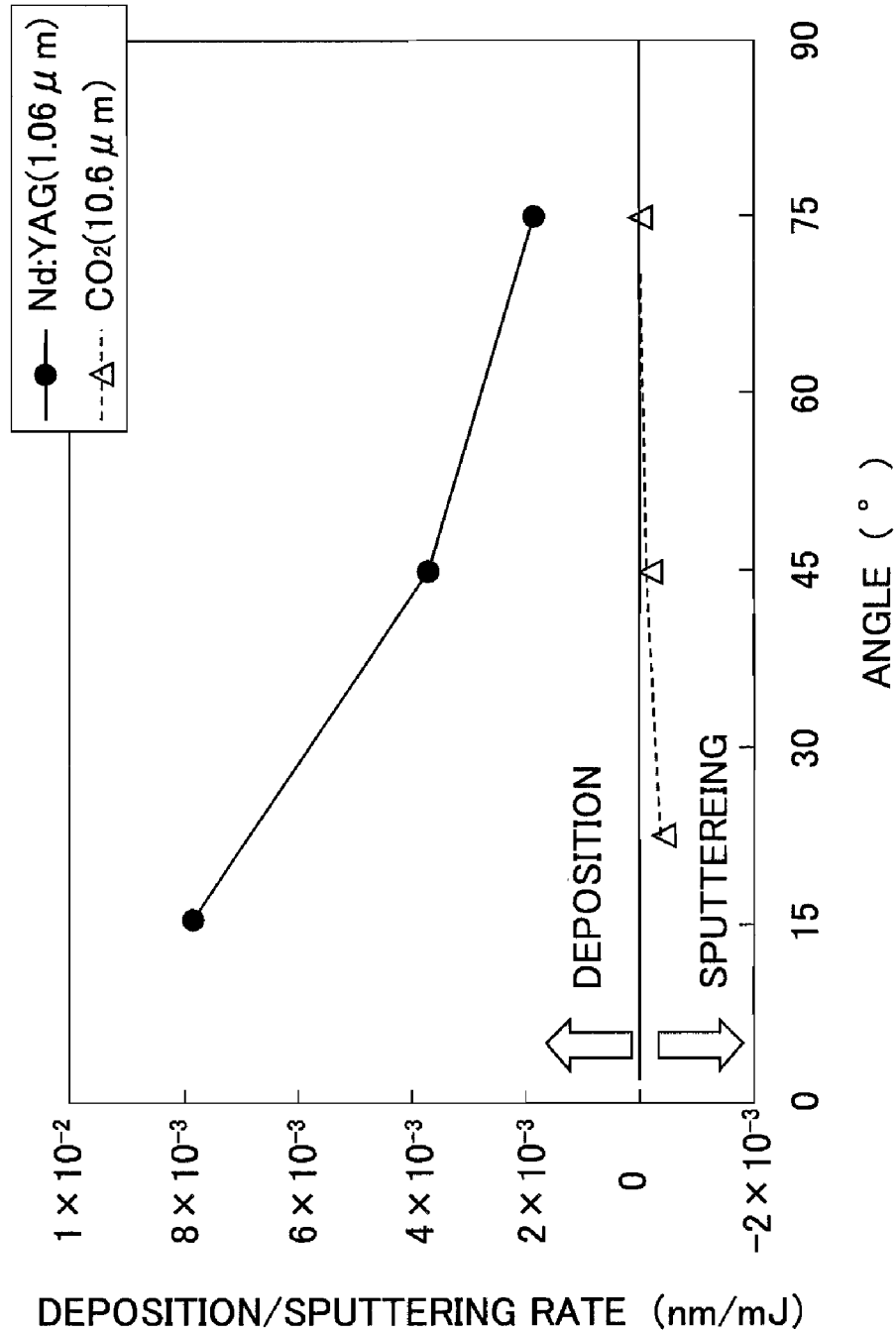
FIG. 6 shows results of a laser beam application experiment when a tin plate having a thickness of 1 mm is used as the target.

FIG. 6 shows results of a laser beam application experiment when a tin plate having a thickness of 1 mm is used as the target. In FIG. 6, the horizontal axis indicates the angle with respect to the reference angle, and the vertical axis indicates the rate of deposition or sputtering, i.e., the change in film thickness per energy of EUV light (wavelength 13.5 nm, 2% BW, 2πsr) generated in the plasma.

As the drive lasers, the Nd:YAG laser (wavelength 1.06 μm) and the $CO_2$ laser (wavelength 10.6 μm) are used. Conventionally, when the tin plate is used as the target, the deposition amount of debris is very large. Actually, as shown in FIG. 6, when the Nd:YAG laser is used, the film thickness significantly increases in total (deposition). On the other hand, when the $CO_2$ laser is used, the film thickness changes little and slightly decreases (sputtering).

Figure 7:
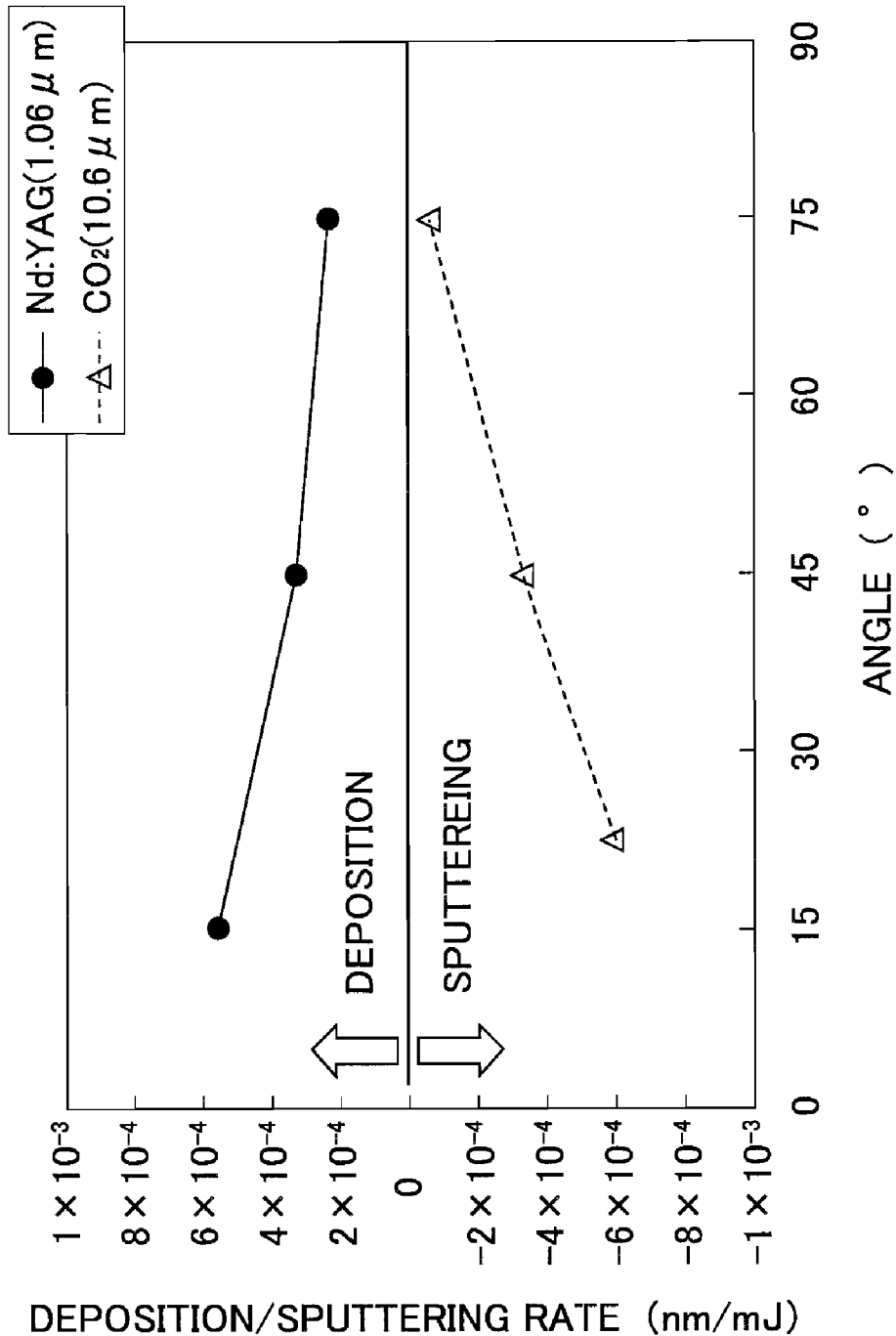
FIG. 7 shows results of a laser beam application experiment when a tin foil having a thickness of 15 µm is used as the target.

FIG. 7 shows results of a laser beam application experiment when a tin foil having a thickness of 15 μm is used as the target. In FIG. 7, although the amount of change in film thickness is much smaller compared to the case where the tin plate is used as shown in FIG. 6, the results are similar in that the film thickness increases when the Nd:YAG laser is used and the film thickness decreases when the $CO_2$ laser is used.

Referring to FIG. 1 again, the number of layers of the multilayer film constituting the reflecting surface of the EUV collector mirror 15 is about 250 at the maximum in the current technology, and the film can be used until the thickness of about 1.6 μm is worn away in that case. On the other hand, as explained above, when tin is deposited on the reflecting surface of the EUV collector mirror in a thickness of about 0.75 nm, the reflectance of the EUV collector mirror 15 is about 10% reduced and the mirror becomes unusable.

Accordingly, the control unit 30 obtains the amount of neutral particles deposited on the reflecting surface of the EUV collector mirror 15 (deposition amount) based on the detection result (output signal) of the mirror damage detector 21 and the amount of multilayer film worn away from the reflecting surface of the EUV collector mirror 15 (sputtering amount) based on the detection result (output signal) of the ion detector 22, and thereby, adjusts the pulse width and/or energy of the excitation laser beam radiated from the drive laser 13 such that the deposition amount and the sputtering amount are balanced or the deposition amount is slightly smaller than the sputtering amount.

Thus, the deposition of debris on the reflecting surface of the EUV collector mirror 15 can be prevented and the life of the EUV collector mirror 15 can be extended. In this regard, it is desirable that the control unit 30 holds the EUV light intensity at the light emission point substantially constant based on the detection result (output signal) of the EUV light detector 24.

Next, forms of targets to be used in the extreme ultra violet light source according to the embodiment will be explained. In the embodiment, targets having various forms such as wires, tapes, rods, plates or solid droplets can be used.

Figure 8:
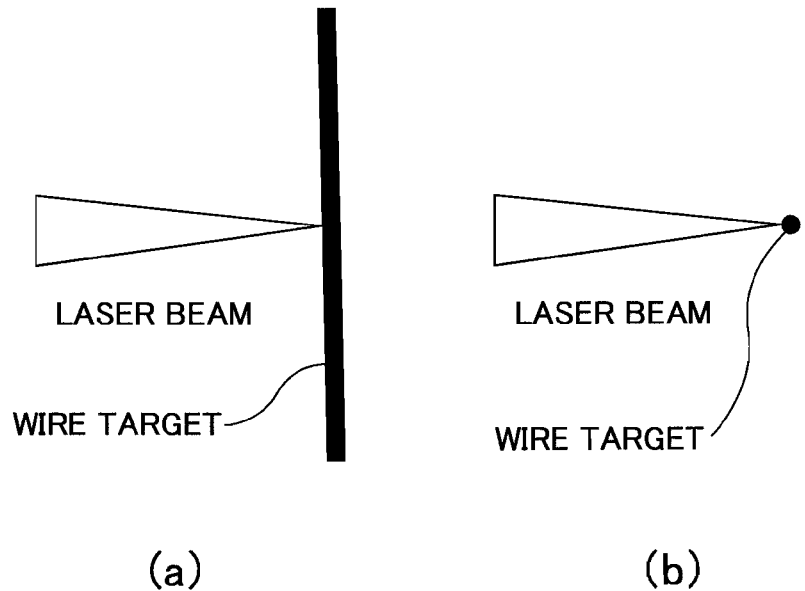
FIG. 8 shows a state in which an excitation laser beam is applied to a wire target.
Figure 9:
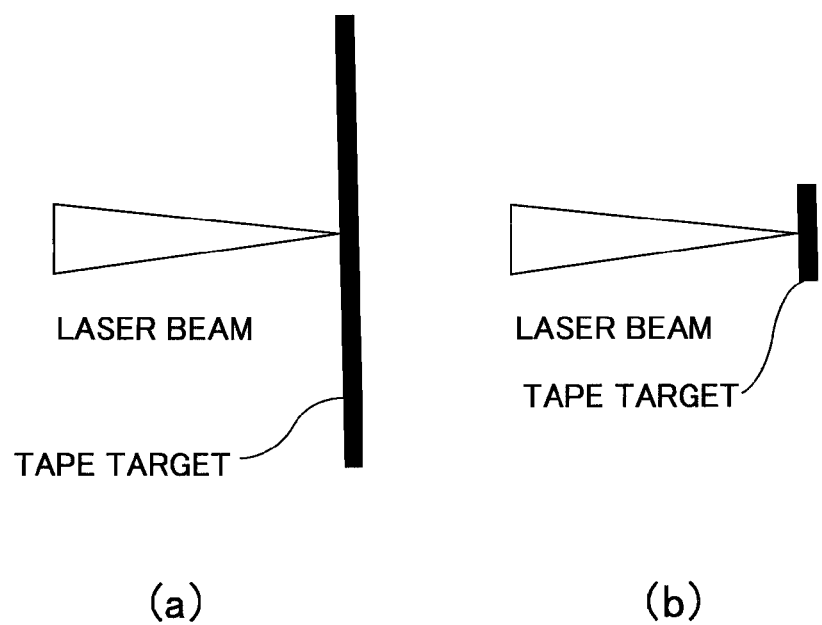
FIG. 9 shows a state in which the excitation laser beam is applied to a tape target.

FIG. 8 shows a state in which the excitation laser beam is applied to a wire target, where FIG. 8 (a) is a side view and FIG. 8 (b) is a plan view. FIG. 9 shows a state in which the excitation laser beam is applied to a tape target, where FIG. 9 (a) is a side view and FIG. 9 (b) is a plan view.

Figure 10:
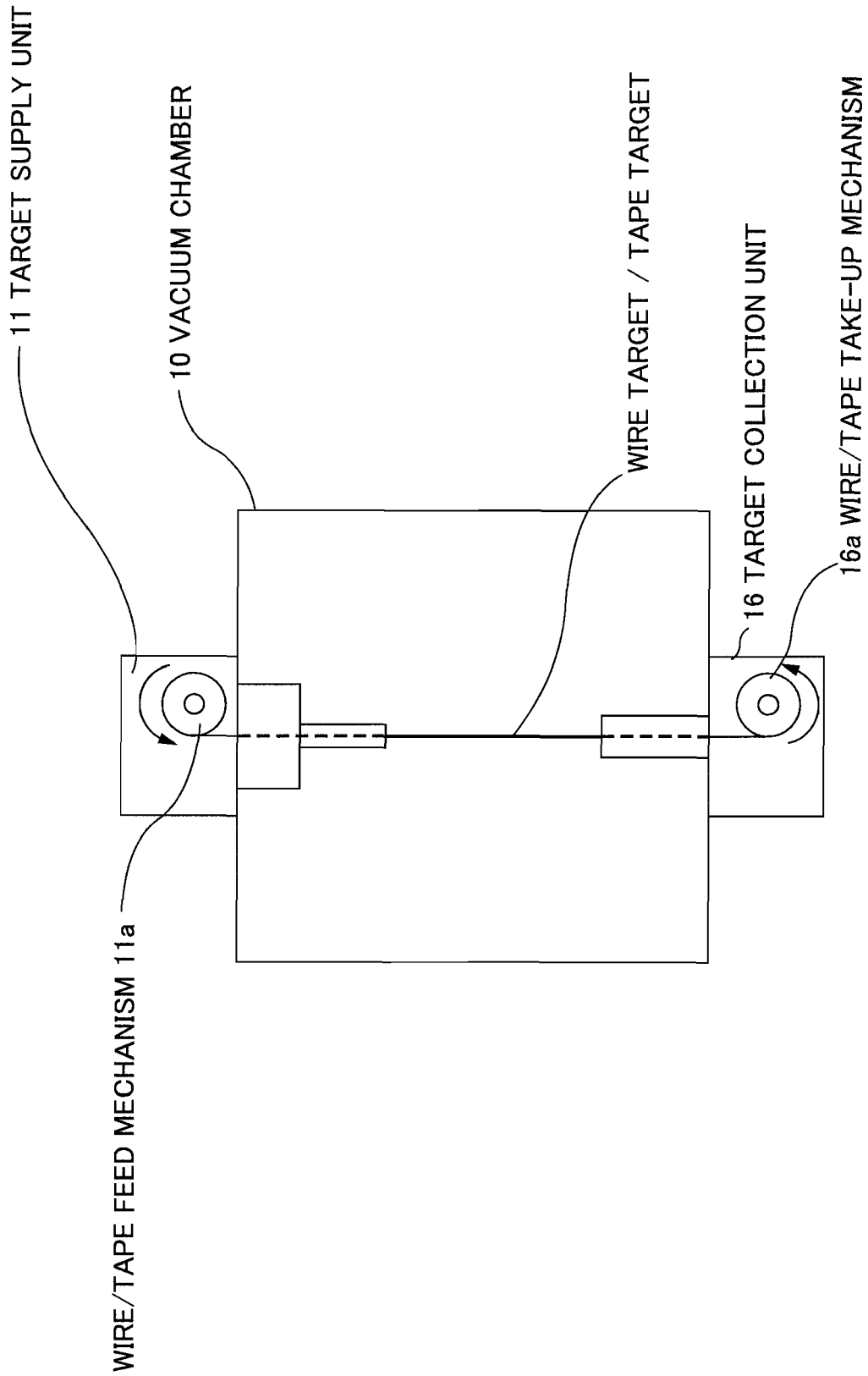
FIG. 10 shows a target supply unit for supplying the wire target or tape target.

FIG. 10 shows a target supply unit for supplying the wire target or tape target. In the target supply unit 11, a wire/tape feed mechanism 11a including a feed reel and a motor for feeding the wire target or tape target is provided. Further, in the target collection unit 16, a wire/tape take-up mechanism 16a including a take-up reel and a motor for taking up the wire target or tape target is provided. In this example, the wire/tape feed mechanism 11a and the wire/tape take-up mechanism 16a constitute part of the target supply unit.

Under the control of the control unit 30 (FIG. 1), the wire/tape take-up mechanism 16a turns the take-up reel for taking up the target and the wire/tape feed mechanism 11a turns the feed reel while applying back tension thereto, and thus, a new part of the target is supplied to a predetermined position within the vacuum chamber 10 and the part that has been applied with the excitation laser beam is collected. The target collected from the vacuum chamber 10 by the target collection unit 16 may be returned to the target supply unit 11 by providing the target circulation unit 17 as shown in FIG. 1.

Figure 11:
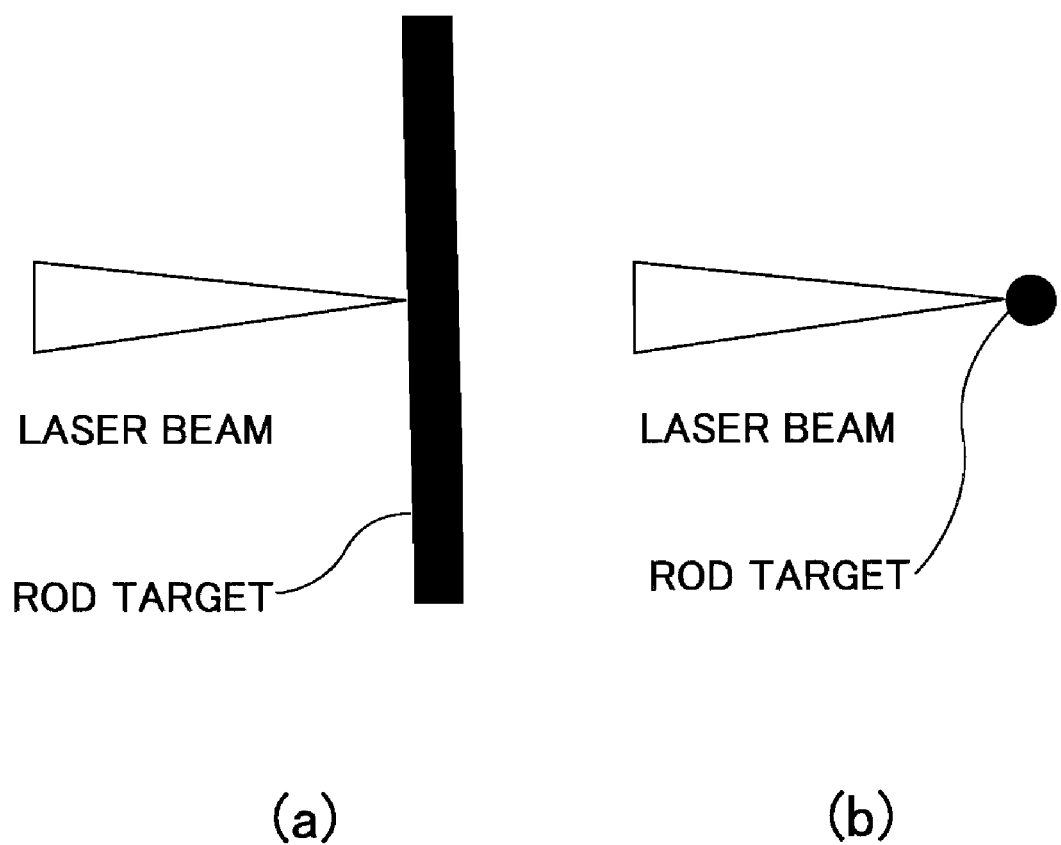
FIG. 11 shows a state in which the excitation laser beam is applied to a rod target.
Figure 12:
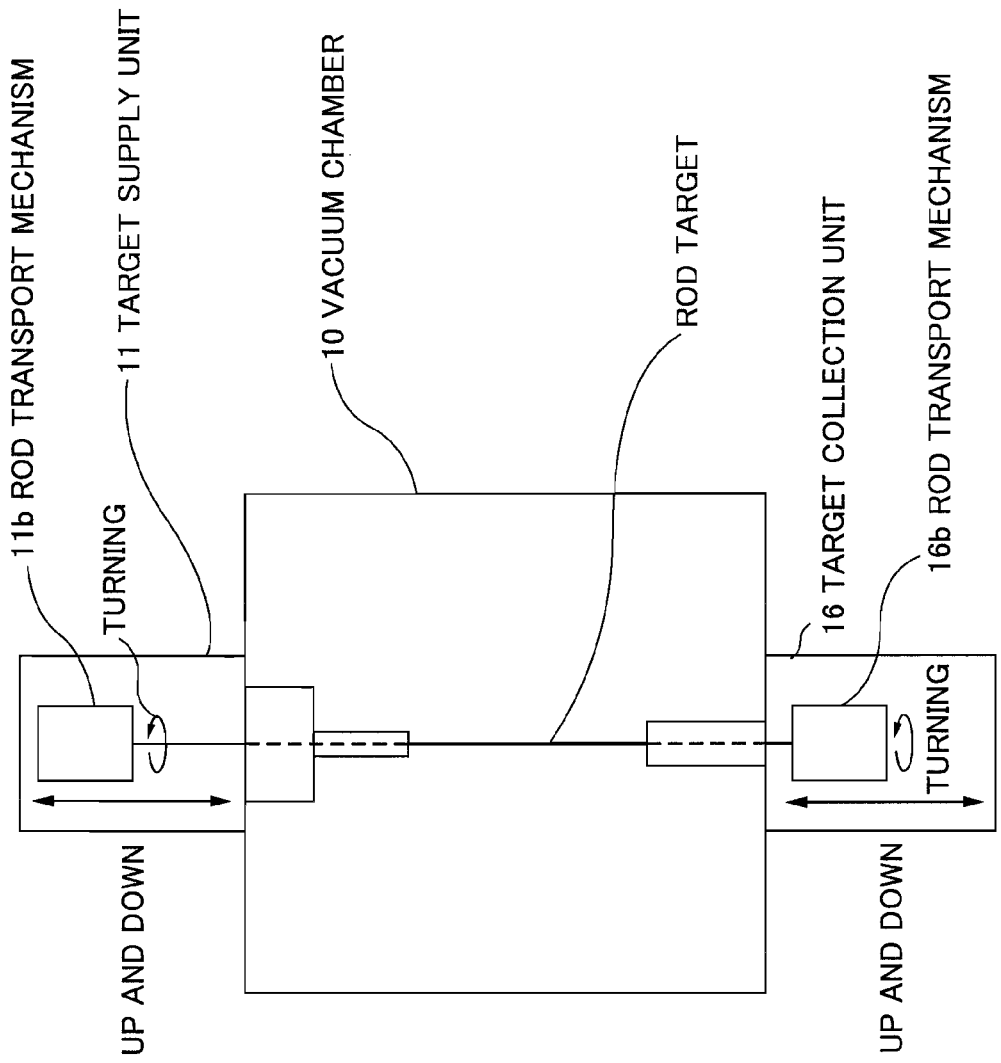
FIG. 12 shows a target supply unit for supplying the rod target.

FIG. 11 shows a state in which the excitation laser beam is applied to a rod target, where FIG. 11 (a) is a side view and FIG. 11 (b) is a plan view. FIG. 12 shows a target supply unit for supplying the rod target. The target supply unit 11 and the target collection unit 16 are provided with a rod transport mechanisms 11b and 16b that transport the rod target by holding both ends of the rod target and moving it in parallel (vertically up and down move) while turning it. In this example, the rod transport mechanisms 11b and 16b constitute part of the target supply unit. Under the control of the control unit 30 (FIG. 1), the rod transport mechanisms 11b and 16b vertically move the rod target while turning it, and thereby, the excitation laser beam is constantly applied to new parts of the rod target.

Figure 13:
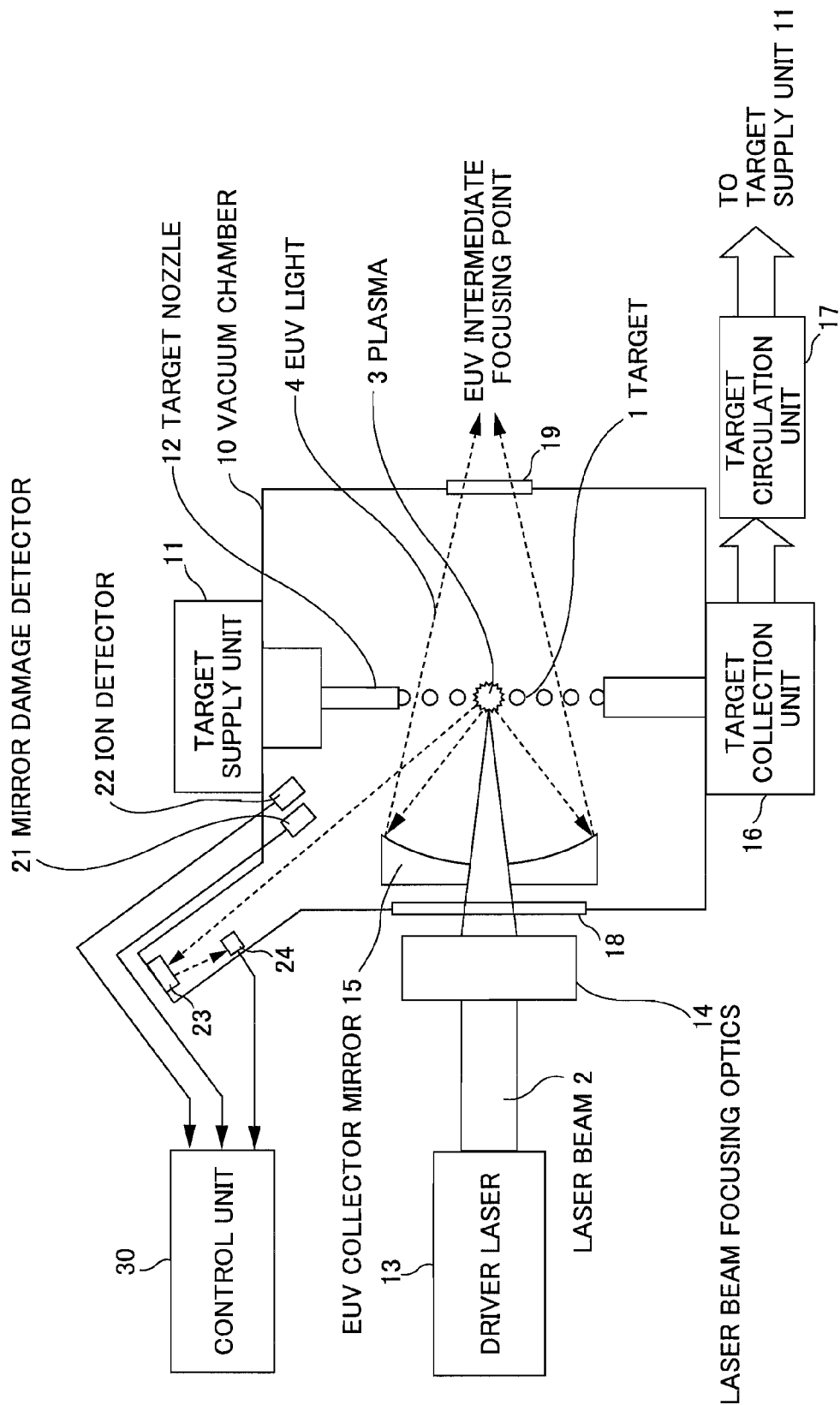
FIG. 13 is a side view showing an internal structure of the EUV light source apparatus using a solid droplet target.

FIG. 13 is a side view showing an internal structure of the EUV light source apparatus using a solid droplet target. A target nozzle 12 is connected to the target supply unit 11. The target supply unit 11 includes a position adjustment mechanism for adjusting the fall position of the target 1, and supplies the target 1 to the predetermined position within the vacuum chamber 10 via the target nozzle 12 while adjusting the fall position of the target 1. Further, plural target supply units 11 may be provided according to the supply speed of the solid droplet target.

The target collection unit 16 includes a position adjustment mechanism for adjusting the position of collecting of the target 1, and collects the target that has not been plasmarized while adjusting the position of collecting the target. The collected target may be returned by the target circulation unit 17 to the target supply unit 11 and reused.

Figure 14:
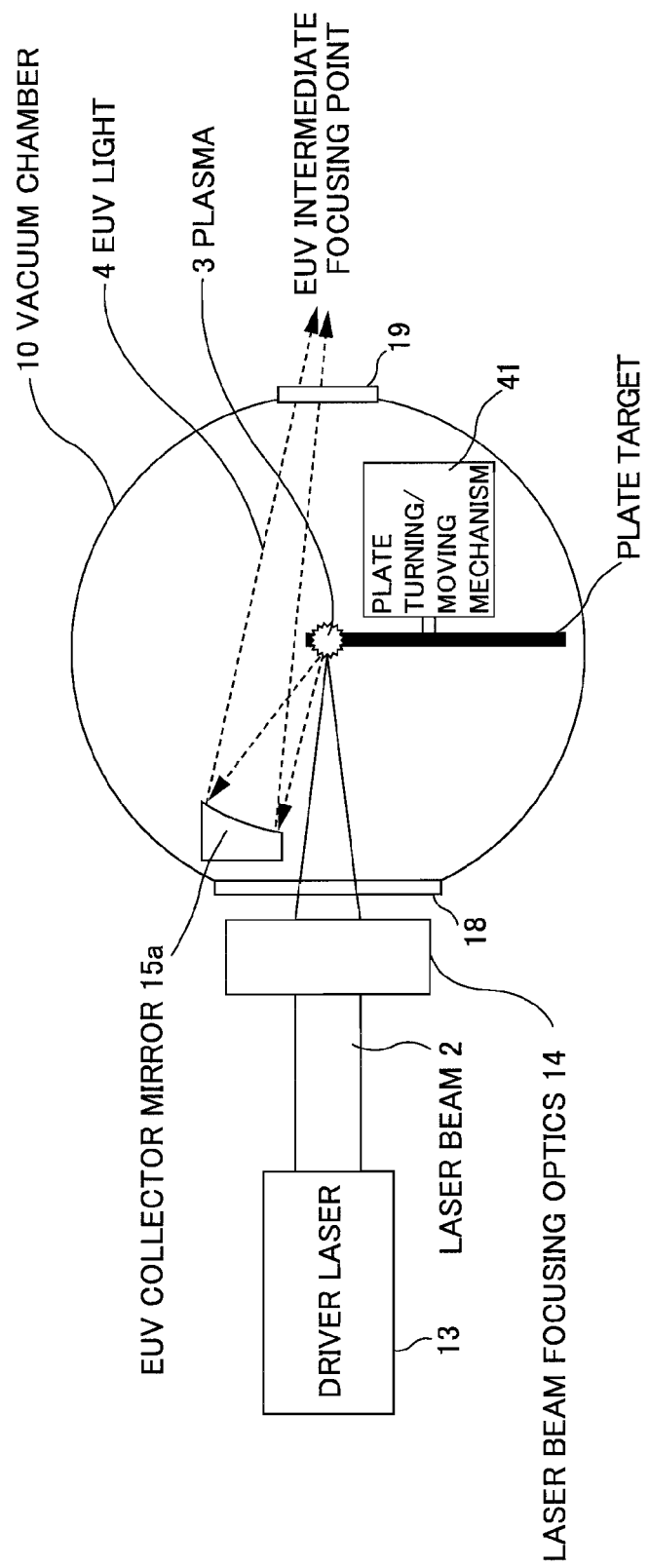
FIG. 14 is a plan view showing an internal structure of the EUV light source apparatus using a plate target.

FIG. 14 is a plan view showing an internal structure of the EUV light source apparatus using a plate target. In this example, the plate target has a disc shape, and the excitation laser beam is applied to the circular surface. The EUV light source apparatus has a plate turning/moving mechanism 41 that turns the plate target and/or moves the plate target in parallel. The plate turning/moving mechanism 41 moves the plate target in parallel from bottom to top in the drawing while turning it, so that the excitation laser beam is constantly applied to new parts of the plate target.

In the EUV light source apparatus shown in FIG. 14, the area of an EUV collector mirror 15a is smaller than that of the EUV collector mirror 15 shown in FIG. 1, so that the EUV light reflected by the EUV collector mirror 15a is not applied to the plate target. Thereby, the collection solid angle of the EUV collector mirror 15a becomes smaller.

Next, the second embodiment of the present invention will be explained.

Figure 15:
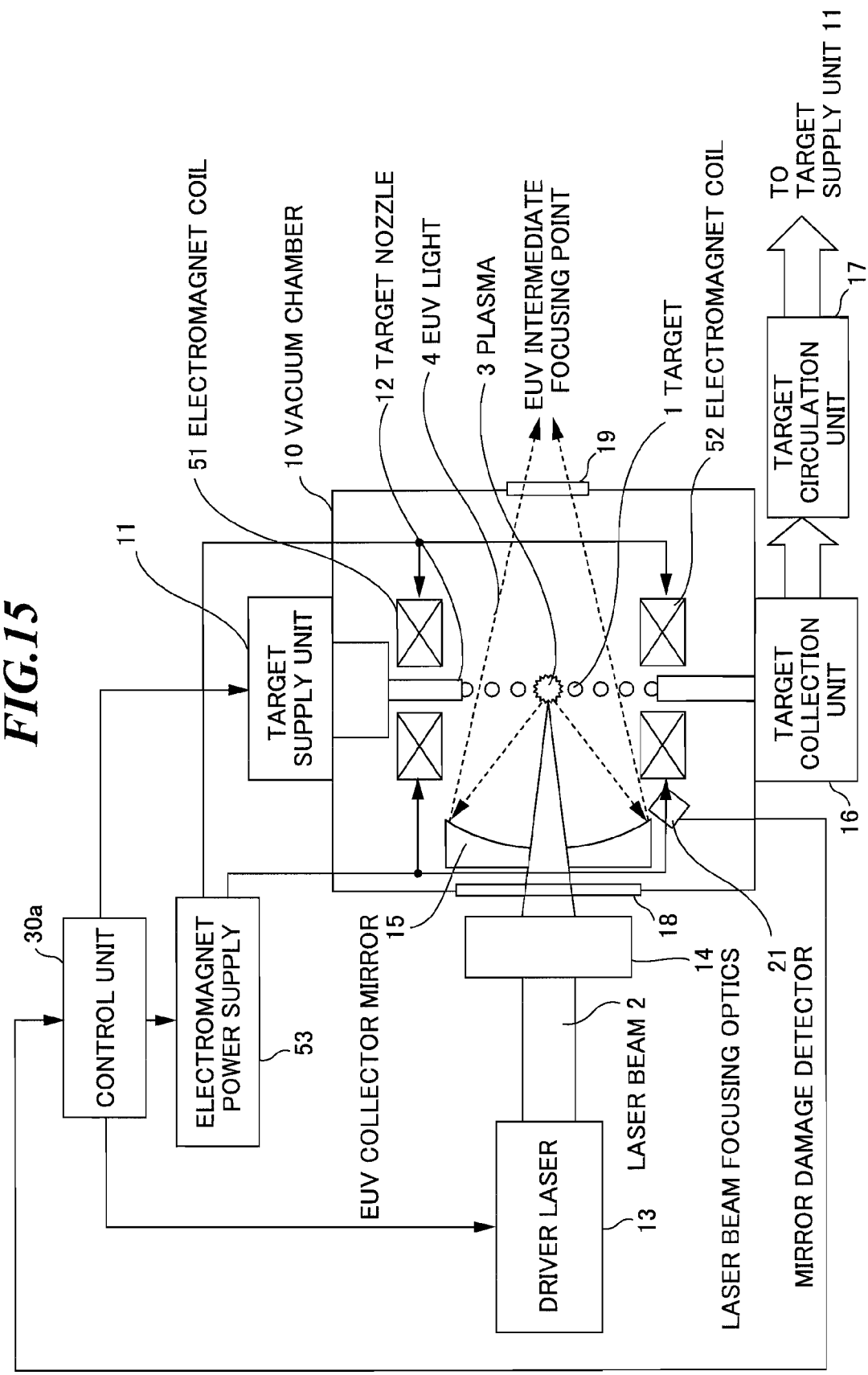
FIG. 15 shows a configuration of an EUV light source apparatus according to the second embodiment of the present invention.

FIG. 15 shows a configuration of an EUV light source apparatus according to the second embodiment of the present invention. The EUV light source apparatus according to the embodiment further includes electromagnet coils 51 and 52 as a magnetic field generating unit for generating a magnetic field when applied with current, and an electromagnetic power supply 53 that supplies current to the electromagnet coils 51 and 52 in addition to the EUV light source apparatus shown in FIG. 13, and includes a control unit 30a that controls the entire EUV light source apparatus including the electromagnetic power supply 53 in place of the control unit 30.

Figure 16:
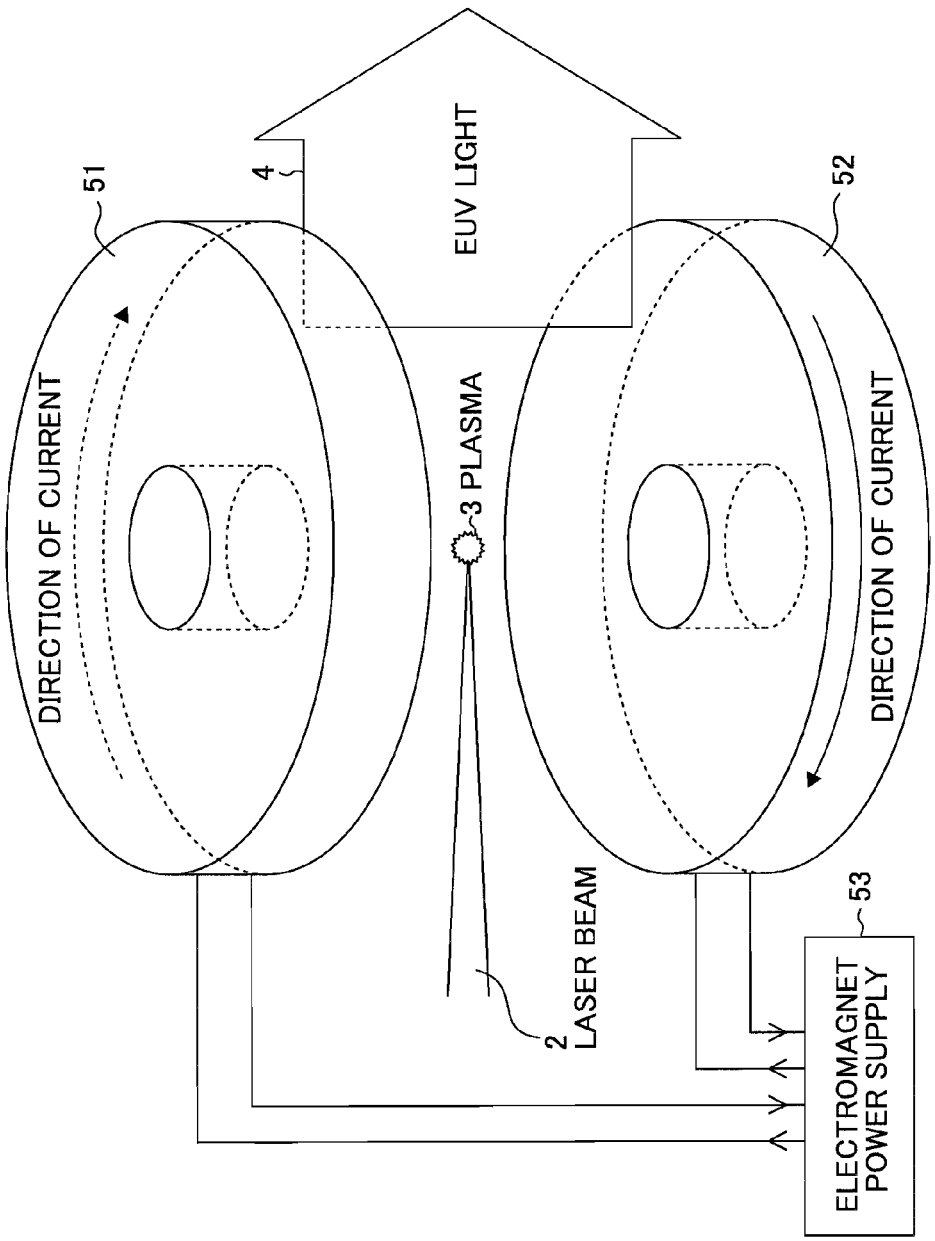
FIG. 16 is a perspective view of electromagnet coils shown in FIG. 15.

FIG. 16 is a perspective view of the electromagnet coils shown in FIG. 15. As shown in FIG. 16, the electromagnet coils 51 and 52 respectively have cylindrical shapes and are located such that the central axes of the two coils are in line to form a pair of mirror coils. Further, the electromagnet coils 51 and 52 are located such that the central axes may pass through the light emission point. The central axes of the electromagnet coils 51 and 52 may be perpendicular to the laser beam 2, or may not be perpendicular to the laser beam 2 unless they cut across the collection optical path of the EUV light. Current is supplied to the electromagnet coils 51 and 52 in a direction shown by arrows in FIG. 16.

The control unit 30a shown in FIG. 15 controls the timing at which the driver laser 13 generates the excitation laser beam, the timing at which the target supply unit 11 supplies the target, the timing at which the electromagnetic power supply 53 flows current through the electromagnet coils 51 and 52, and so on.

In the embodiment, a mirror magnetic field is formed by the electromagnet coils 51 and 52 with the generated plasma 3 in between, the light emission point of the EUV light is placed in the magnetic field, and positively charged ions emitted from the plasma 3 are trapped around the light emission point.

Figure 17:
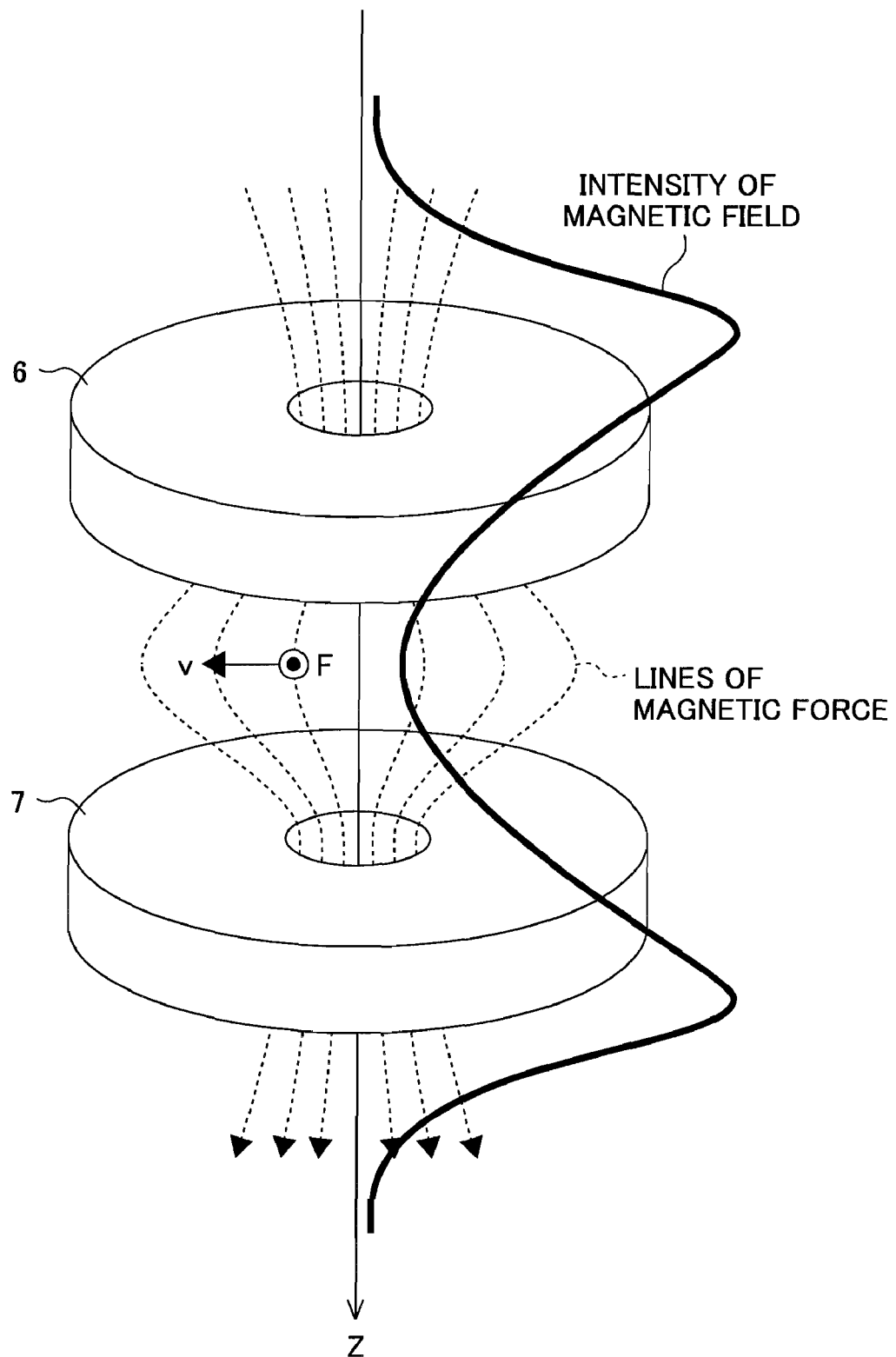
FIG. 17 is a diagram for explanation of a principle of trapping ions by using a mirror magnetic field.

FIG. 17 is a diagram for explanation of a principle of trapping ions by using a mirror magnetic field. In FIG. 17, defining that the axis of the electromagnet coils 51 and 52 is the Z-axis, the intensity of the magnetic field along the Z-axis is shown by a solid line and the lines of magnetic force are shown by broken lines. As shown in FIG. 17, when the electromagnet coils 51 and 52 are located such that the central axes thereof are aligned and current in the same direction is flown in the electromagnet coils 51 and 52, a magnetic field is formed in which the magnetic flux density is higher near the electromagnet coils 51 and 52 and the magnetic flux density is lower between the electromagnet coils 51 and 52.

Figure 18:
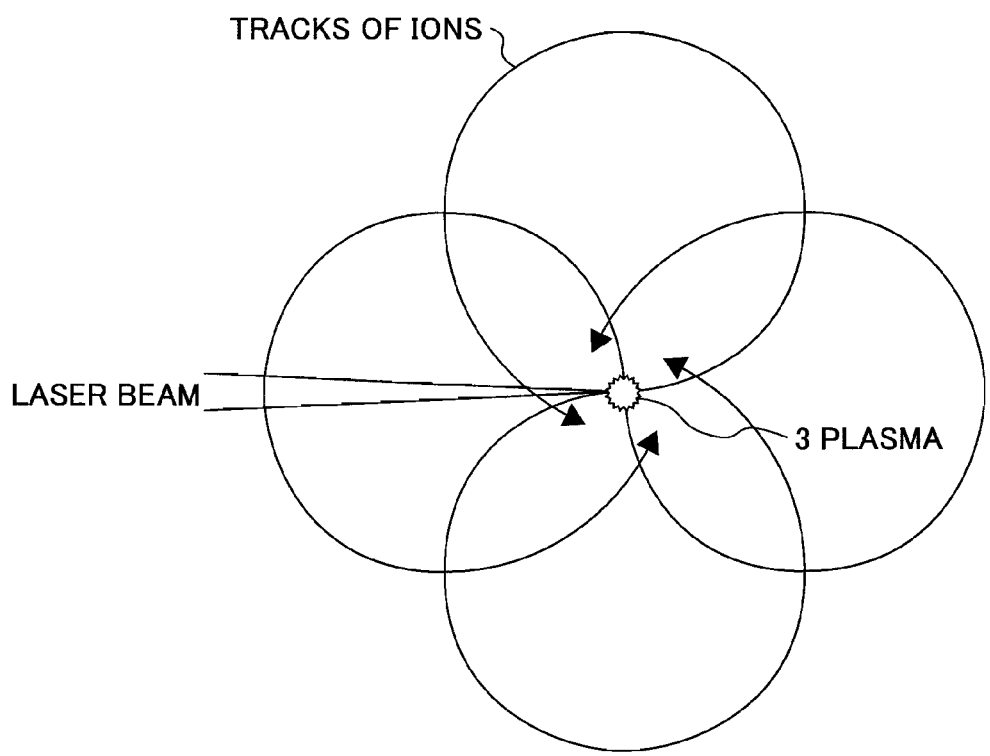
FIG. 18 shows tracks of ions when the interior of the EUV light source apparatus shown in FIG. 15 is seen from above.

A positive ion generated near the Z-axis and having a velocity "v" in a direction perpendicular to the Z-axis is subject to a force "F" in the tangential direction of a circle centered at the Z-axis, and trapped near the Z-axis. FIG. 18 shows tracks of ions when the interior of the EUV light source apparatus shown in FIG. 15 is seen from above. In FIG. 18, the tracks of ions around the Z-axis are enlarged. As shown in FIG. 18, the ion generated near the Z-axis and having a velocity in a direction perpendicular to the Z-axis is subject to a force perpendicular to the velocity within a plane perpendicular to the Z-axis, rotated, and trapped near the Z-axis.

On the other hand, an ion having a velocity along the Z-axis is hardly acted by the magnetic field, but the ion traveling in the Z-axis direction does not collide with the EUV collector mirror 15. Further, the ion having the velocity component along the Z-axis can be turned around near the light emission point when the magnetic field is generated to satisfy the following expression (1)

$$\sin\theta > (B_{MIN}/B_{MAX})^{1/2} \qquad (1)$$

Where $B_{MIN}$ is the lowest magnetic flux density between the electromagnet coils 51 and 52, $B_{MAX}$ is the highest magnetic flux density near the electromagnet coils 51 and 52, and θ is an angle formed by the velocity vector of an ion in a position where the magnetic flux density is $B_{MIN}$ and the Z-axis. The $B_{MiN}$ and $B_{MAX}$ are determined according to the shapes of the electromagnet coils 51 and 52.

The ion that satisfies the expression (1) is confined in a potential valley by the magnetic field generated by the electromagnet coils 51 and 52, while the ion that does not satisfies the expression (1) is not confined by the magnetic field. However, the electromagnet coils 51 and 52 and the EUV collector mirror 15 may be located such that the ion that does not satisfies the expression (1) may not collide with the EUV collector mirror 15.

The magnetic field can trap electrons radiated from the plasma around the light emission point as well as the positive ions, and thus, the diffusion rate of positive ions that tend to diffuse due to the coulomb forces between the positive ions can be reduced by the coulomb forces between the positive ions and the electrons. Therefore, by trapping electrons around the light emission point, Larmor radii of positive ions can be reduced and the positive ions can be easily trapped around the light emission point.

Referring to FIG. 15 again, the control unit 30a controls the target supply unit 11 to repeatedly supply the target 1 at predetermined intervals, and controls the driver laser 13 to generate the laser beam 2 in a period in which the target 1 is supplied. Concurrently, the electromagnet coils 51 and 52 may generate a stationary magnetic field, or generate a pulse magnetic field according to the generation of the laser beam 2. When a pulse magnetic field is generated, the control unit 30a controls the electromagnetic power supply 53 to generate the pulse magnetic field with the electromagnet coils 51 and 52 in a period from the time when the generation of the laser beam 2 is started to the time when generation of the laser beam 2 is stopped and the ions lose kinetic energy to the degree that the ions do not cause damage on the EUV collector mirror 15.

Further, the EUV light source apparatus includes a mirror damage detector 21 located near the EUV collector mirror 15 for monitoring the change in film thickness of the EUV collector mirror 15 and detects the change in thickness of a sample film (a film for measurement) due to neutral particles and ions emitted from the plasma. Accordingly, based on the detection result (output signal) of the mirror damage detector 21, the control unit 30a can control the electromagnetic power supply 53 to adjust the magnetic field intensity such that the amount of neutral particles deposited on the sample film (deposition amount) and the amount of components worn away from the sample film (sputtering amount) may be balanced, or the deposition amount may be slightly smaller than the sputtering amount.

Next, the third embodiment of the present invention will be explained.

Figure 19:
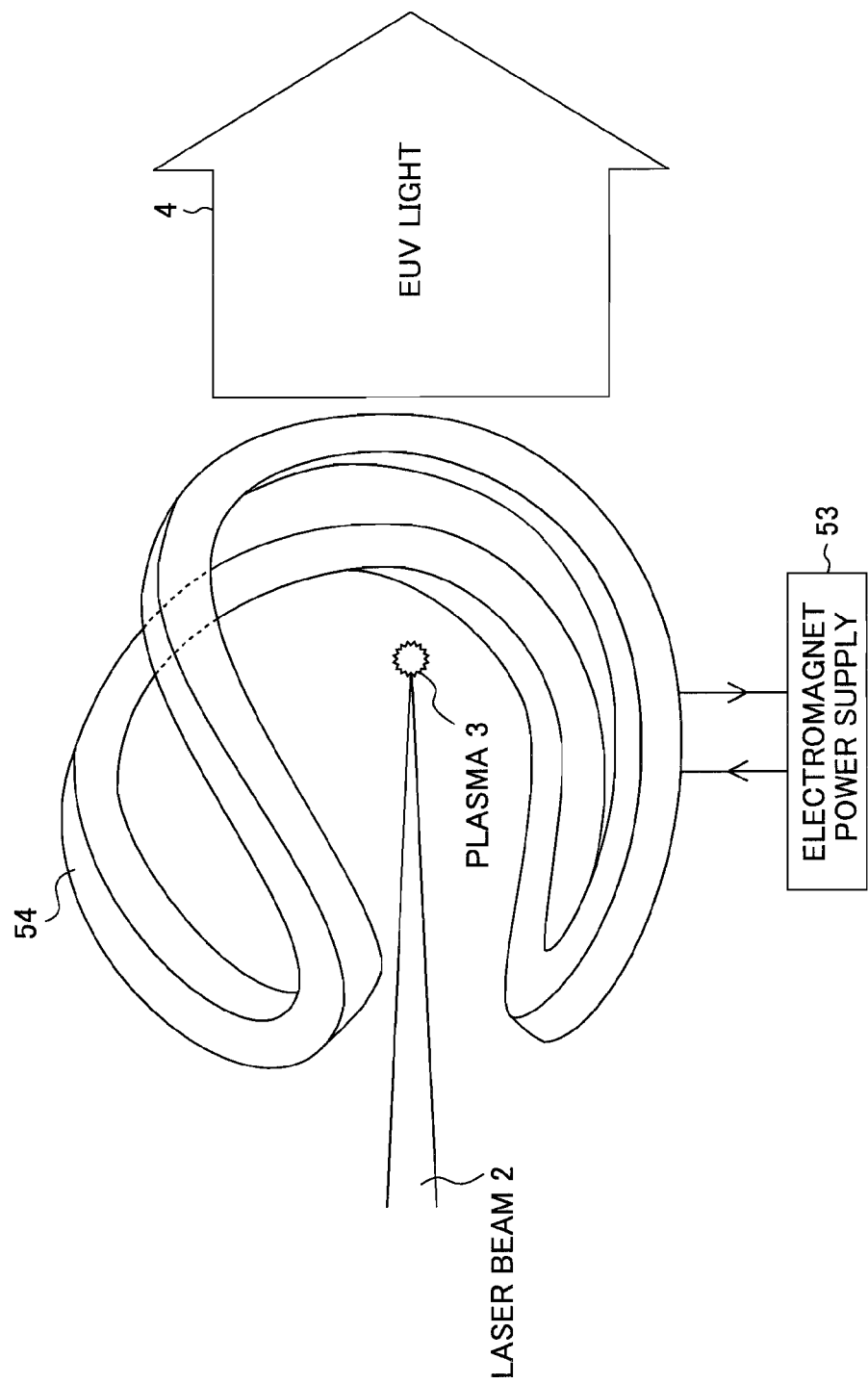
FIG. 19 is a perspective view of an electromagnet coil in an EUV light source apparatus according to the third embodiment of the present invention.

FIG. 19 is a perspective view of an electromagnet coil in an EUV light source apparatus according to the third embodiment of the present invention. The component elements other than the electromagnet coil are the same as those in the EUV light source apparatus according to the second embodiment of the present invention as shown in FIG. 15.

As shown in FIG. 19, the electromagnet coil 54 has a shape along the seams of a baseball, and generally called a baseball coil. The electromagnet coil 54 is provided so as to encompass the plasma 3 to be generated and wrap around the light emission point of EUV light, and thus, the light emission point of EUV light is located within the magnetic field. Especially, in the embodiment, the electromagnet coil 54 is provided such that the light emission point of EUV light is at the center of the ball shape. The baseball magnetic field generated by the electromagnet coil 54 traps positively charged ions emitted from the plasma generated at the light emission point around the light emission point.

Figure 20:
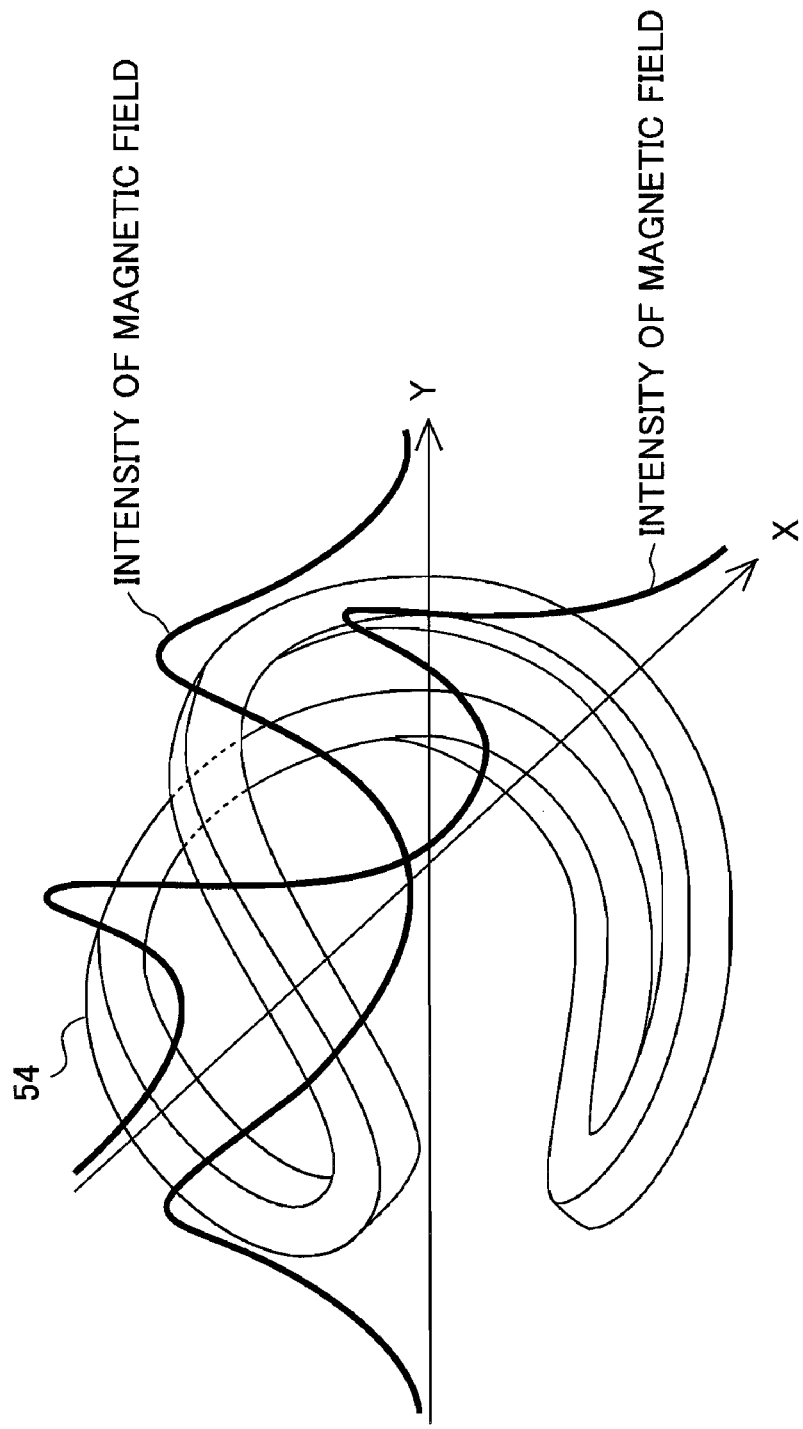
FIG. 20 is a diagram for explanation of a principle of trapping ions by using a baseball magnetic field.

FIG. 20 is a diagram for explanation of a principle of trapping ions using a baseball magnetic field. In FIG. 20, the intensity of the magnetic field along the X-axis and the Y-axis passing through the center of the electromagnet coil 54 and perpendicular to each other is shown by a solid line. As shown in FIG. 20, when current is flown in the electromagnet coil 54, a magnetic field in which the magnetic flux density is lower at the central part of the electromagnet coil 54 and the magnetic flux density increases in every direction from the central part toward the periphery of the ball configuration is formed.

Therefore, an ion having a velocity in a direction away from the central part of the electromagnet coil 54 is turned around by the strong intensity near the end surface of the nearly spherical shell-shaped space surrounded by the electromagnet coil 54, and the ion can be trapped near the center of the electromagnet coil 54 (around the light emission point).

The invention claimed is:

1. An extreme ultra violet light source apparatus which generates extreme ultra violet light by applying a laser beam to a target, said apparatus comprising:
    a chamber in which extreme ultra violet light is generated;
    a target supply unit which supplies one of tin and lithium as a target to a predetermined position within said chamber;
    a $CO_2$ laser which applies a laser beam based on pulse operation to the target supplied by said target supply unit so as to generate plasma;
    a collector mirror which has a multilayer film on a reflecting surface thereof and collects the extreme ultra violet light radiated from the plasma to output the extreme ultra violet light;
    a first detector which detects an amount of neutral particles emitted from the plasma;
    a second detector which detects an amount of ions emitted from the plasma; and
    a control unit which obtains an amount of neutral particles deposited on said reflecting surface of said collector mirror based on a detection result of said first detector and an amount of said multilayer film worn away from said reflecting surface of said collector mirror based on a detection result of said second detector, and thereby adjusts a pulse width and/or energy of the laser beam radiated from said $CO_2$ laser such that the amount of the neutral particles deposited on said reflecting surface of said collector mirror is not larger than the amount of said multilayer film worn away from said reflecting surface of said collector mirror.

2. The extreme ultra violet light source apparatus according to claim 1, wherein said $CO_2$ laser applies a laser beam having intensity of $3\times10^9$ W/cm$^2$ to $5\times10^{10}$ W/cm$^2$ to the target supplied by said target supply unit.

3. The extreme ultra violet light source apparatus according to claim 2, wherein said $CO_2$ laser applies a laser beam having a pulse width of 10 ns to 15 ns to the target supplied by said target supply unit.

4. The extreme ultra violet light source apparatus according to claim 1, wherein said $CO_2$ laser applies a laser beam having a pulse width of 10 ns to 15 ns to the target supplied by said target supply unit.

5. The extreme ultra violet light source apparatus according to claim 1, wherein said target supply unit supplies the target to the predetermined position within said chamber while adjusting a position of the target.

6. The extreme ultra violet light source apparatus according to claim 1, wherein said target supply unit includes a feed mechanism including a feed reel and a motor which feed a wire-like or tape-like target, and a take-up mechanism including a take-up reel and a motor which take up the target.

7. The extreme ultra violet light source apparatus according to claim 1, wherein said target supply unit includes two rod transport mechanisms which transport a rod-like target by holding both ends of the target and moving the target in parallel while turning the target.

8. The extreme ultra violet light source apparatus according to claim 1, wherein said target supply unit supplies a solid droplet-shaped target to the predetermined position within said chamber via a target nozzle while adjusting a fall position of the target.

9. The extreme ultra violet light source apparatus according to claim 1, wherein said target supply unit includes a plate turning/moving mechanism which turns a plate-like target and/or moves the target in parallel.

10. The extreme ultra violet light source apparatus according to claim 1, further comprising:
   a magnetic field generating unit which generates a magnetic field when current is supplied thereto so as to trap charged particles emitted from said plasma.

11. The extreme ultra violet light source apparatus according to claim 10, wherein said magnetic field generating unit includes one of a pair of mirror coils and a baseball coil.

12. The extreme ultra violet light source apparatus according to claim 10, further comprising:
   a current supply unit which supplies current to said magnetic field generating unit such that said magnetic field generating unit generates a stationary magnetic field.

13. The extreme ultra violet light source apparatus according to claim 10, further comprising:
   a current supply unit which supplies current to said magnetic field generating unit; and a control unit which controls said current supply unit to cause said magnetic field generating unit to periodically generate a pulse magnetic field.

14. An extreme ultra violet light source apparatus which generates extreme ultra violet light by applying a laser beam to a target, said apparatus comprising:
   a chamber in which extreme ultra violet light is generated;
   a target supply unit which supplies one of tin and lithium as a target to a predetermined position within said chamber;
   a CO$_7$ laser which applies a laser beam based on pulse operation to the target supplied by said target supply unit so as to generate plasma;
   a collector mirror which has a multilayer film on a reflecting surface thereof and collects the extreme ultra violet light radiated from the plasma to output the extreme ultra violet light;
   a magnetic field generating unit which generates a magnetic field when current is supplied thereto so as to trap charged particles emitted from said plasma;
   a current supply unit which supplies current to said magnetic field generating unit;
   a detector which detects a change in thickness of a measurement film due to neutral particles and ions emitted from said plasma; and
   a control unit which controls said current supply unit based on a detection result of said detector such that an amount of neutral particles deposited on the measurement film is not larger than an amount of components worn away from the measurement film.

15. The extreme ultra violet light source apparatus according to claim 14, wherein said magnetic field generating unit includes one of a pair of mirror coils and a baseball coil.

16. The extreme ultra violet light source apparatus according to claim 14, wherein said current supply unit supplies current to said magnetic field generating unit such that said magnetic field generating unit generates a stationary magnetic field.

17. The extreme ultra violet light source apparatus according to claim 14, wherein said control unit controls said current supply unit to cause said magnetic field generating unit to periodically generate a pulse magnetic field.

18. The extreme ultra violet light source apparatus according to claim 14, wherein said target supply unit supplies the target to the predetermined position within said chamber while adjusting a position of the target.

19. The extreme ultra violet light source apparatus according to claim 14, wherein said target supply unit includes a feed mechanism including a feed reel and a motor which feed a wire-like or tape-like target, and a take-up mechanism including a take-up reel and a motor which take up the target.

20. The extreme ultra violet light source apparatus according to claim 14, wherein said target supply unit includes two rod transport mechanisms which transport a rod-like target by holding both ends of the target and moving the target in parallel while turning the target.

* * * * *